United States Patent [19]
Lin

[11] Patent Number: 6,002,178
[45] Date of Patent: Dec. 14, 1999

[54] MULTIPLE CHIP MODULE CONFIGURATION TO SIMPLIFY TESTING PROCESS AND REUSE OF KNOWN-GOOD CHIP-SIZE PACKAGE (CSP)

[76] Inventor: Paul T. Lin, 673 Hillcrest Ter., Fremont, Calif. 94539

[21] Appl. No.: 08/968,981

[22] Filed: Nov. 12, 1997

[51] Int. Cl.⁶ .......................... H01L 23/48; H01L 23/52; H01L 29/40
[52] U.S. Cl. .......................... 257/778; 257/693; 257/777; 257/723; 257/48
[58] Field of Search .............................. 257/778, 48, 777, 257/737, 738, 693, 723, 783; 228/180.22

[56] References Cited

U.S. PATENT DOCUMENTS

| 5,241,133 | 8/1993 | Mullen, III et al. | 257/693 |
| 5,654,590 | 8/1997 | Kuramochi | 257/778 |

FOREIGN PATENT DOCUMENTS

| 3-116749 | 5/1991 | Japan | 257/48 |
| 5-82662 | 4/1993 | Japan | 257/778 |
| 6-120379 | 4/1994 | Japan | 257/48 |

*Primary Examiner*—Mahshid Saadat
*Assistant Examiner*—Jhihan B Clark
*Attorney, Agent, or Firm*—Bo-In Lin

[57] ABSTRACT

The present invention discloses a chip-size package (CSP) ready multiple chip module (MCM) board having a top surface and a bottom surface for mounting and packaging a plurality of integrated circuit (IC) chips on the top surface. The MCM board is provided with a plurality of chip connection terminals on the top surface for electrically connecting to the IC chips. The MCM board further includes a plurality of via connectors in electrical connection with each of the MCM connection terminals. The MCM board further includes a plurality of CSP connection terminals disposed on the bottom surface substantially under the IC chips wherein each of the via connectors penetrating the MCM board for electrically connecting the CSP connection terminals to the MCM connection terminals.

11 Claims, 7 Drawing Sheets

MULTIPLE CHIP MODULE CONFIGURATION TO SIMPLIFY TESTING PROCESS AND REUSE OF KNOWN-GOOD CHIP-SIZE PACKAGE (CSP)

BACKGROUND OF THE INVENTION

1. Field of the Invention

This invention relates generally to the electronic package. More particularly, this invention relates to a novel multiple chip module (MCM) packaging configuration to simplify assembling and testing processes of MCM such that a lower production cost is achieved, and to simplify the procedures to repackage and utilize the know-good-die (KGD) after testing such that an effective method is provided to minimize the wastes of the known-good-dice.

2. Description of the Prior Art

There is a challenge faced by those applying the multiple chip module (MCM) technology to package multiple electronic chips into a single module. This challenge arises from the fact that a MCM module can function properly only if every chip assembled into this MCM package is individually a good die. Also, due to the accumulative effect, even a small percentage of reject rate for the individual chips generates an unacceptable loss to the MCM packages using these chips. For example, a 99% chip acceptance rate for the individual chips, when assembled into eight-chip modules (X8 modules) as dual in-line memory module (DIMM) or single-in-line-memory module (SIMM) packages, an 8% loss or rework rate is generated which is clearly unacceptable.

In order to reduce wastes of resources committed to packaging chips which are not good dice, burn-in tests of individual chips are performed to identify the known good dice (KGD) before a MCM packaging processes are carried out. However, the processes for burning-in each individual chip or chip-size package (CSP) are very expensive due to the requirements of special testing sockets, and large dedicated burn-in board. Furthermore, difficult handling techniques are required to test these individual chips. Due to these special and expensive requirements for qualifying an integrated circuit (IC) chip as a known good die (KGD), it generally costs more to test a chip than to test a package. For the same reasons, the price of a known good die is approximately five to seven times as that of a untested die. Even with the high cost of testing and a much higher price to use the KGD, due to the concern of accumulative losses when chips are assembled as multiple chip modules, there is no choice but to employ the KGDs.

In addition to the costs related to the requirement of using the known good dice, two level of substrates are employed in conventional multiple chip modules wherein known good dice are assembled. The first level of substrate is used for packaging individual chips. The multiple chip module substrate is a second level substrate which is used for mounting multiple chips. Additional costs are incurred in this two level substrate structure since it requires more material and processing. This two substrate structure further presents another disadvantage that the packages have a high profile. In order to enhance device miniaturization, more and more modern applications implemented with packaged electronic chips require a reduced thickness. Conventional MCM packages implemented with a two-level substrate structure have very limited usefulness in modern miniaturized devices when an electronic packages with a very small thickness are required.

Therefore, a need still exits in the art to provide an improved configuration and procedure for testing and packaging the multiple chip modules to reduce the cost of testing and to more conveniently and economically reuse the known good dice when a known good die is packaged with other failed chips into a multiple-chip-module.

SUMMARY OF THE PRESENT INVENTION

It is therefore an object of the present invention to provide an improved configuration and procedure for testing and packaging the multiple chip modules (MCMs) to reduce the cost of testing and to more conveniently and economically save and reuse the known good dice after the testing in order to overcome the aforementioned difficulties and limitations encountered in the prior art Specifically, it is an object of the present invention to provide an improved MCM configuration and procedure for testing and packaging multiple chips as MCM assemblies by employing a CSP ready MCM board wherein a plurality of CSP contact terminals are provided with CSP-ready via connectors penetrating the MCM board such that the burn-in processes can be directly performed on each MCM such that a requirement to use the high price known good dice to avoid wastes and yield loss is eliminated.

Another object of the present invention is to provide an improved MCM configuration and procedure for testing and packaging multiple chips as MCM assemblies by employing a CSP ready MCM board wherein a plurality of CSP contact terminals are provided with CSP-ready via connectors penetrating the MCM board such that the known good dice (KGD) which are assembled in a failed MCM can be conveniently separated and easily reused without complicated and time consuming rework processes whereby the total production cost can be significantly reduced.

Another object of the present invention is to provide an improved MCM configuration and procedure for testing and packaging multiple chips as MCM assemblies by employing a CSP ready MCM board wherein a plurality of CSP contact terminals are provided with CSP-ready via connectors penetrating the MCM board such that the improved CSP-ready MCM board can be applied for different kinds of integrated circuit chips including flip-chips, wire-bonding chips, and other types of chips, such that this novel CSP-ready reusable MCM board can be broadly applied to assemble various kind of electronic packages.

Another object of the present invention is to provide an improved MCM configuration and procedure for testing and packaging multiple chips as MCM assemblies by mounting multiple chips directly on a CSP-ready MCM board wherein only a single level of substrate is required for majority of MCM assemblies which pass the burn-in and functional tests such that the height of the package profile of the MCM assembly can be reduced.

Briefly, in a preferred embodiment, the present invention comprises a chip-size package (CSP) ready multiple chip module (MCM) board having a top surface and a bottom surface for mounting and packaging a plurality of integrated circuit (IC) chips on the top surface. The MCM board is provided with a plurality of chip connection terminals on the top surface for electrically connecting to the IC chips. The MCM board further includes a plurality of via connectors in electrical connection with each of the MCM connection terminals. The MCM board further includes a plurality of CSP connection terminals disposed on the bottom surface substantially under the IC chips wherein each of the via connectors penetrating the MCM board for electrically connecting the CSP connection terminals to the MCM connection terminals.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1A:
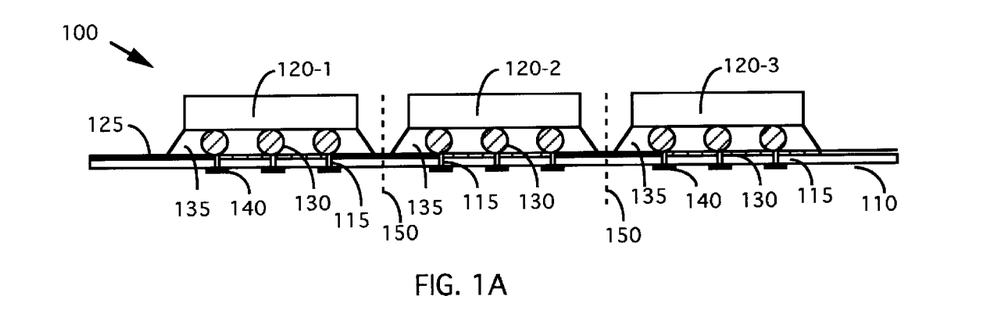
FIGS. 1A and 1B show the cross sectional view and top views respectively for a flip-chip multiple chip module assembly supported on a CSP-ready MCM board of this invention.
Figure 1B:
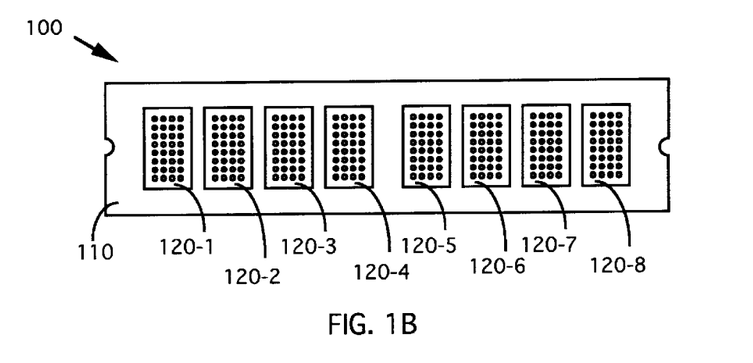

Please refer to FIGS. 1A and 1B for a cross sectional view and a bottom view of a chip-size-package (CSP) ready multiple chip module board 110 for testing and packaging a MCM assembly 100 which includes multiple flip chips 120-1 to 120-3. Similar to a conventional multiple chip module substrate, the CSP-ready MCM board 110 is provided with a plurality of interconnect traces 125 on the top surface for interconnecting each of these flip chips 120-1 to 120-3 via the solder-ball array 130 disposed on each individual flip chip package. Filling the space between the solder balls of the solder-ball array 130 are also under-filled materials 135. The CSP-ready MCM board 110 includes a plurality of CSP-ready vias filled with conductive material thus forming a plurality of CSP-ready via connectors 115. These CSP-ready via connectors can be blind via connectors for multiple layer MCM board as that described in FIG. 1E below. Each CSP-ready via connector is corresponding to and aligned with a solder ball in the solder-ball array 130 of the flip chip 120-1 to 120-3. In electrical connection with each of these CSP ready via connector is a CSP-ready contact terminal 140 formed on the bottom surface of the CSP-ready MCM board 110.

Figure 1C:
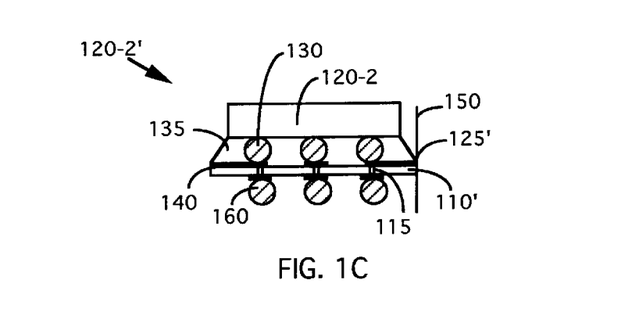
FIG. 1C shows a cross sectional view of a known good die separated from the MCM assembly of FIGS. 1A and 1B, after the burn-in and tests then assembled as a known good CSP chip according to the configuration of this invention.

By mounting these flip chips 120-1 to 120-3 on this CSP-ready MCM board 110, the burn-in and testing processes can be performed directly on this MCM assembly 100 to determine if this MCM assembly 100, by packaging and connecting these flip chips, is a good MCM assembly. If it is, then the whole MCM assembly 100 can be shipped out as a finished product. If one or several of these flip chips are determined as unacceptable during the burn-in and testing processes, the MCM assembly is not useful in this MCM packaged form. However, several of the multiple chips would have been identified as known good die (KGD) after completion of the burn-in and testing processes. These chips identified as known good die can be separated from the CSP ready MCM board 110 by cuffing them off from the separation lines 150. Referring to FIG. 1C, for example if the flip chip 120-2 is identified as known good die, this flip chip 120-2 can be separated as an individual chip size package (CSP) 120-2' by forming a solder-ball array 160 connecting to each of the CSP-ready contact terminals 140 on the bottom surface provided in a cutoff section 110' of the CSP-ready MCM board 110 previously employed for supporting and packaging the MCM assembly 100. Each of these known good CSP chips, e.g., CSP chip 120-2', has exposed edge traces 125' which are used to interconnect multiple chips but are now cutoff to form this individual known good CSP chip 120-2' for reuse.

According to FIGS. 1A to 1C and above descriptions, the present invention discloses a chip-size package (CSP) ready multiple chip module (MCM) board 110 having a top surface and a bottom surface for mounting and packaging a plurality of integrated circuit (IC) chips 120-1 to 120-3 on the top surface. The MCM board is provided with a plurality of chip, e.g., the solder balls of the solder-ball array 130 or the wire bonding pads 230, on the top surface for electrically connecting to the IC chips. The CSP-ready MCM board further includes a plurality of via connectors 115 in electrical connection with each of the MCM connection terminals 130. The MCM board further includes a plurality of CSP connection terminals 140 disposed on the bottom surface substantially under the IC chips wherein each of the via connectors 115 penetrating the MCM board 110 for electrically connecting the CSP connection terminals 130 to the MCM connection terminals 140.

Figure 1D:
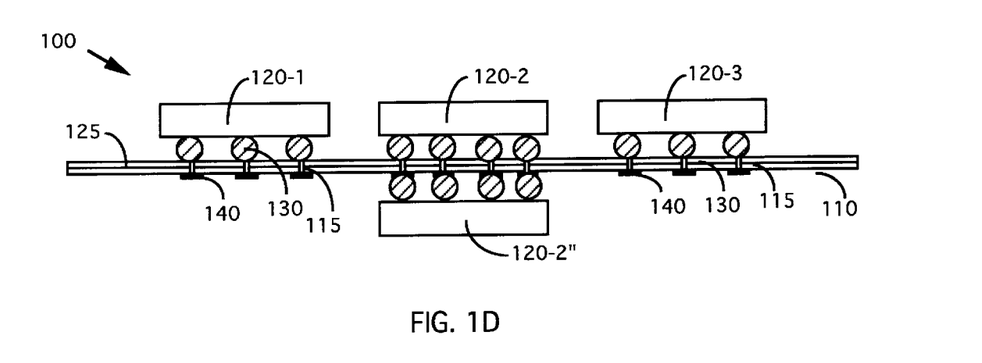
FIG. 1D shows a cross sectional view of another preferred embodiment where a known good replacement chip is attached to the bottom of the CSP-ready MCM board, provided with pre-defined connection terminals corresponding to the known good replacement chip, to totally replace a failed chip.

FIG. 1D shows an alternate method to repair a failed MCM assembly when one or more than one chips have failed in the burn-in or determined to be unacceptable after completion of the product acceptance tests. Suppose the chip 120-2 is determined to be an unacceptable chip, a flip chip 120-2" which is a known good die is attached to the bottom of the MCM board 110 to replaced the known-bad-die (KBD) 102-2. The CSP-ready connection terminals 140 disposed on the bottom surface of the CSP-ready MCM board 110 are formed to have identical footprint and in mirror image to a CSP chip or a flip chip for the known bad die. The CSP-ready connection terminals are ready for connection to a replacement and repair chip 120-2" which is preferably either a flip chip or a CSP chip.

Figure 1E:
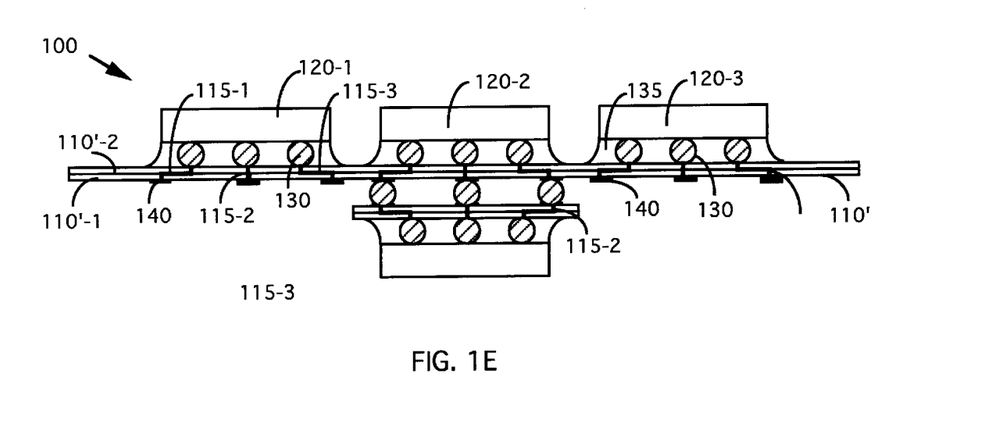
FIG. 1E shows the structure of a multiple layer CSP-ready MCM substrate wherein a blind via connector are formed through these multiple layers.

FIG. 1E shows a cross sectional view of an alternate preferred embodiment of a CSP-ready MCM board 110' of this invention. The MCM board 110' is a multiple layer board wherein a plurality of passive circuit elements 112, e.g., capacitors, resistors, inductors, etc., are formed in the middle layers 110'-1 and 110-2'. Each of these multiple layers of this MCM board 110' are formed with via connectors 115-1 and 115-2, etc., to provide electric connections between the solder-ball array 130 disposed on the top surface of the MCM board 110' and the CSP-ready connection terminals 140 disposed on the bottom surface of the multiple-layer MCM board 110'.

Figure 2A:
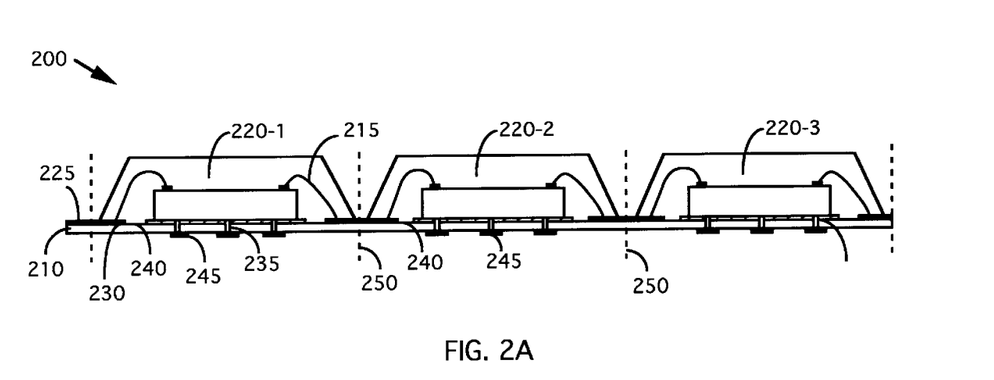
FIGS. 2A and 2B show the cross sectional view and a partial top views respectively for a wire-bonding multiple chip module assembly which is supported on a CSP-ready MCM board of this invention.
Figure 2B:
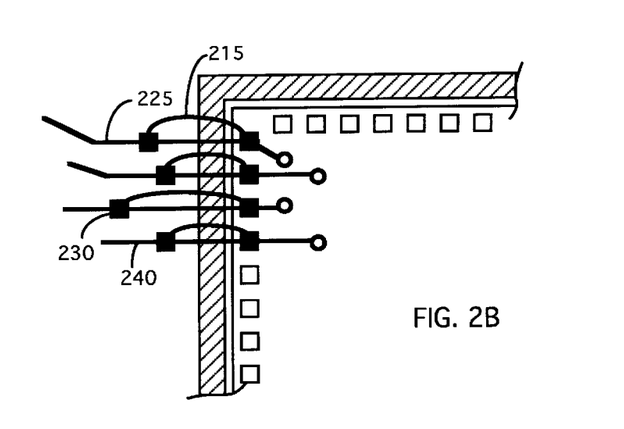

FIGS. 2A to 2B show the cross sectional view and a partial top view of a multiple chip module 200 which includes multiple wire-boding chips, e.g., 220-1 to 220-3 as shown, supported on a CSP-ready MCM board 210 of this invention. Similar to a conventional MCM board, there are a plurality of bonding pads 230 for connecting to bonding wires 215 formed on the top surface of this CSP-ready MCM board. In addition, there are a plurality of conductive traces 225 for connecting other wire bonding chips, e.g., 220-1 and 220-3, etc. The CSP-ready MCM board 210 further includes a plurality of CSP traces, extended inwardly toward the wire bonding chips, for connecting the bonding pads 230 to a plurality of via connector 235. Each of these via connector 235 penetrates the MCM board 210 and connected to a plurality of CSP contact terminal 245. For each bonding pad, there is a corresponding via connector 235 and a CSP contact terminal 245 connected to the bonding pad 230 by a CSP trace 240.

Figure 2C:
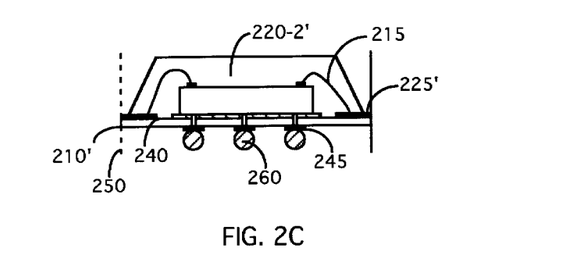
FIG. 2C shows a cross sectional view of a known good wire-bonding die separated from the MCM assembly of FIGS. 2A and 2B, after the burn-in tests and repackaged as a known good CSP chip according to the configuration of this invention.
Figure 2D:
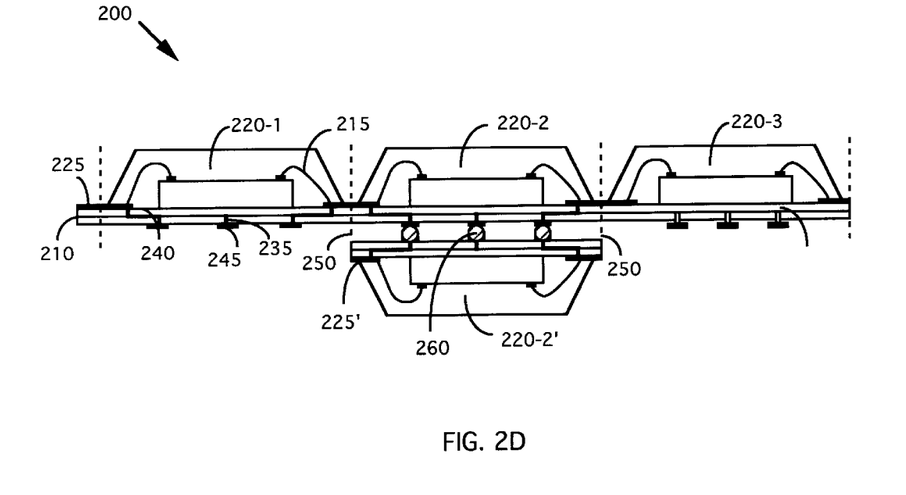
FIG. 2D shows a cross sectional view of a repaired MCM assembly wherein a known-good replacement is attached at the bottom surface of the CSP-ready MCM board, provided with pre-defined connection terminals corresponding the known-good replacement chip, to totally replace a known-bad-die (KBD) according to the MCM configuration of this invention.

Again, by mounting these wire-bonding chips 220-1 to 220-3 on this CSP-ready MCM board 210, the burn-in and testing processes can be performed directly on this MCM assembly 100 to determine if this MCM assembly 200, by packaging and connecting these wire-bonding chips, is a good MCM assembly. If it is, then the whole MCM assembly 200 can be shipped out as a finished product. If one or several of these flip chips are determined as unacceptable during the burn-in and testing processes, the MCM assembly is not useful in this MCM packaged form. However, several of the multiple chips would have been identified as known good die (KGD) after completion of the burn-in and testing processes. These chips identified as known good die can be separated from the CSP ready MCM board 210 by cutting them off from the separation lines 250. Referring to FIG. 2C, for example if the wire-bonding chip 220-2 is identified as known good die, this wire-bonding chip 220-2 can be separated as an individual chip size chip (CSP) 220' by forming a solder-ball array 260 connecting to each of the CSP-ready contact terminals 245 on the bottom surface provided in a cutoff section 210' of the CSP-ready MCM board 210 previously employed for supporting and packaging the MCM assembly 200. Each of these known good (CSP chips, e.g., CSP chip 220-2', has exposed edge traces 225' which are used to interconnect multiple chips but are now cutoff to form this individual known good CSP chip 220-2' for reuse.

Figure 3A:
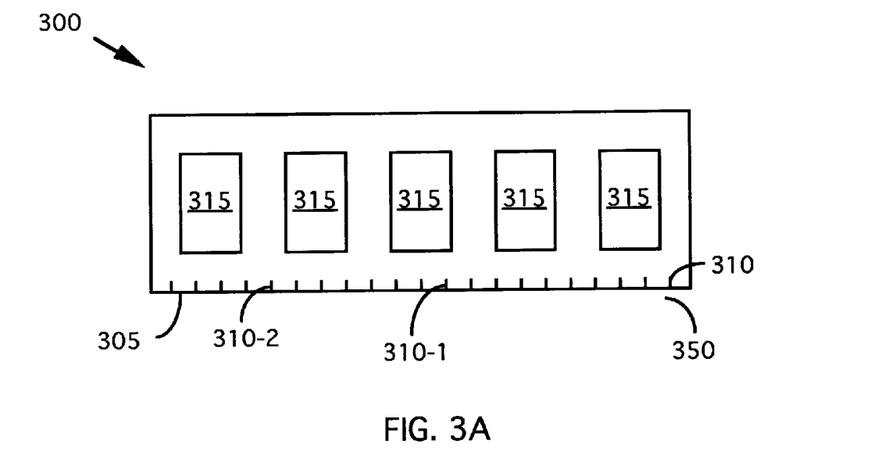
FIG. 3A shows top view of a CSP-ready MCM board which are provided with a plurality of standard edge testing pins for conducting both the burn-in and functional tests employing standard testing sockets.

Referring to FIG. 3A for top view of a CSP-ready MCM board 300 with a plurality of test pins 310 disposed on a testing insertion edge 305. There are multiple chips 315 mounted on this MCM board 300 and a plurality of conductive traces (not shown) connecting the chip connection terminals disposed on the board to the testing pins 310.

Figure 3B:
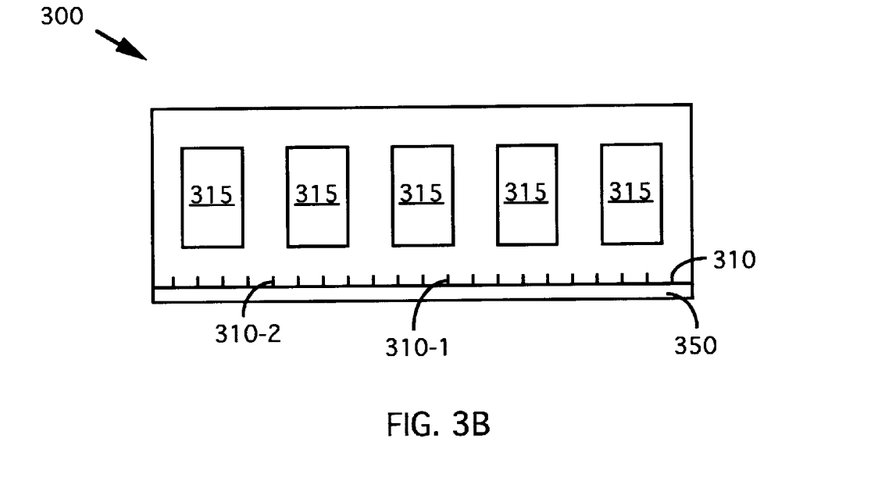
FIG. 3B shows a configuration of the MCM board with edge testing pins inserted into a standard testing socket for carrying out burn-in and functional tests directly on the MCM board.
Figure 3C:
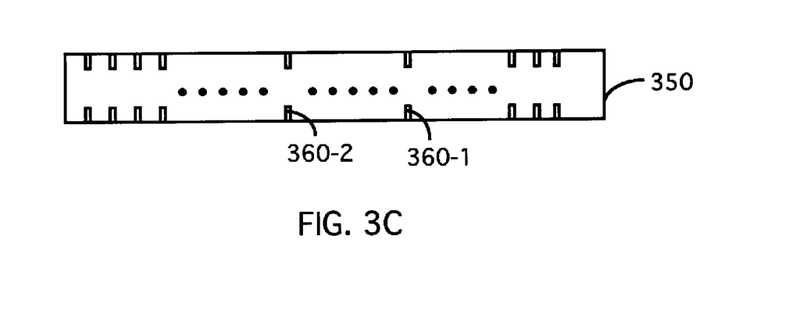
FIG. 3C is a top view of the board-level testing socket.

There are two kinds of test pins among the test pins 310. The first kind of test pins are burn-in test pins 310-1 for connecting to a set of burn-in socket receptors disposed in a standard socket (see FIG. 3B) for conducting a burn-in test. The second kind of test pins are board-level test pins 310-2 for connecting to a set of board-level socket receptors disposed in the standard socket shown in FIG. 3B for conducting a board-level test. Unlike the testing procedures employed in the conventional MCM assembly, the burn-in tests and the board-level tests for the MCM assembly 300 are now carried out directly on the board and using a single standard testing socket as that shown in FIG. 3B below. The procedures are much simplified compared to the conventional processes where the burn-in tests are performed for each individual chip by using special sockets which can endure higher temperatures used for burn-in tests, then the board-level tests are applied when all the chips are mounted on the MCM board. Referring to FIG. 3B, the MCM board 300 is inserted into a standard testing socket 350 for performing a burn-in and board level tests. The standard burn-in and board-level testing socket 350 is made of materials which can sustain a burn-in test temperature ranging from 100 to 150° C. This standard burn-in and board-level testing socket 350 includes two types of socket receptors 360, namely the burn-in socket receptors 360-1 and board-level socket receptors 360-2, for receiving the burn-in test pins 310-1 and the board-level test pins 310-2 respectively. A top view of the board-level testing socket is shown in FIG. 3C. Again, the testing socket 350 is also novel from a conventional board-level test socket. The conventional board-level test sockets are only provided with board level test socket adapters to receive board level test pins. In contrast, the burn-in and board-level testing socket 350 includes a set of socket adapters 360-1 to receive a set of burn-in test pins 310-1 and another set of socket adapters 360-2 to receive a set of board level test pins 310-2. Furthermore, the burn-in and board-level test socket 350 are made with material to sustain a higher burn-in test temperature which is not required in a conventional MCM board test socket.

Figure 4A:
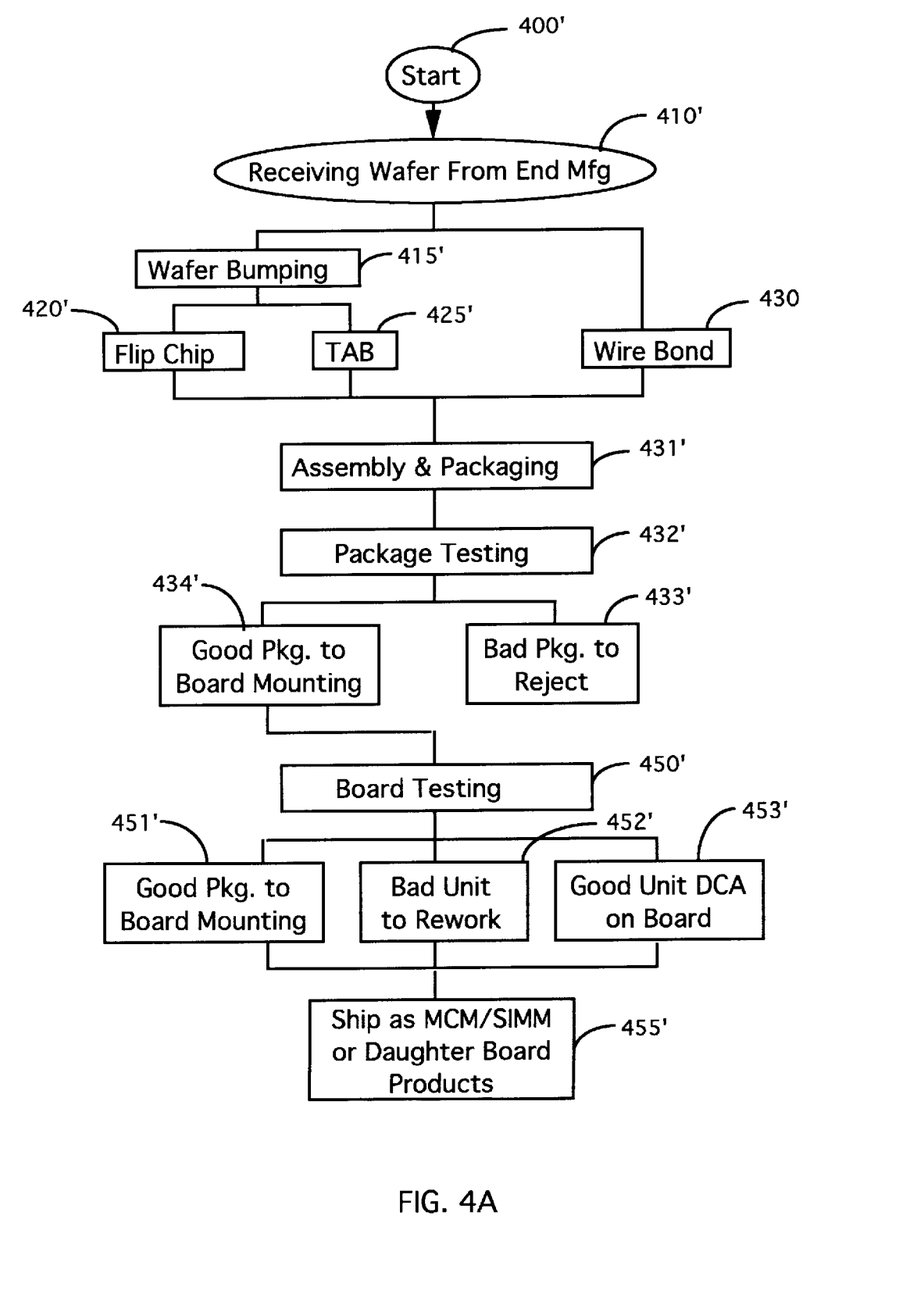
FIGS. 4A and 4B are two flow charts showing the processing steps employed by a conventional MCM packaging and testing method in comparison to a simplified method used by the MCM assembly mounted on a CSP-ready MCM board of this invention.

By employing a CSP-ready MCM board and conducting the burn-in and board level tests directly with the multiple chips mounted on the board as described above, the process flow is significantly simplified. A comparison of these different process flows used by a conventional MCM technique and that of a reusable CSP/MCM are listed in FIGS. 4A and 4B respectively as two flow charts in parallel. The flow charts illustrate the processing steps at different stages including a water stage, a chip package stage, a chip package testing stage, a board testing stage, and a final shipment/rework/reject stage. In FIG. 4A, the processes begin (step 400') by receiving the wafer from front end integrated circuit manufacture facility (step 410'). A wafer bumping step is carried out (step 415') followed by a flip chip (step 420') or TAB (step 425') processes to complete the wafer level preparation works. Otherwise, if it is a wire bond type of chips, a wire bonding process (step 430') is carried out to complete the wafer level preparation works. An assembly and packaging process is performed (step 431') followed by a package testing (step 432') which generally include the burn-in tests for the packaged chips to assure good dice are identified for further multiple chip mounting and testing processes. Bad packages of individual IC chips are identified and rejected (step 433'). The good packages are selected for board mounting (step 434'). A board level testing process is performed (step 450') to identify the MCM assembly which has all good chip packages on board (step 451') and ready for shipment (step 455'). Or, good units direct chip attachment on board are performed to replace the identified bad units (step 453') or the bad units identified are reworked (step 452') to obtain a completely acceptable MCM assembly for shipment (step 455').

Figure 4B:
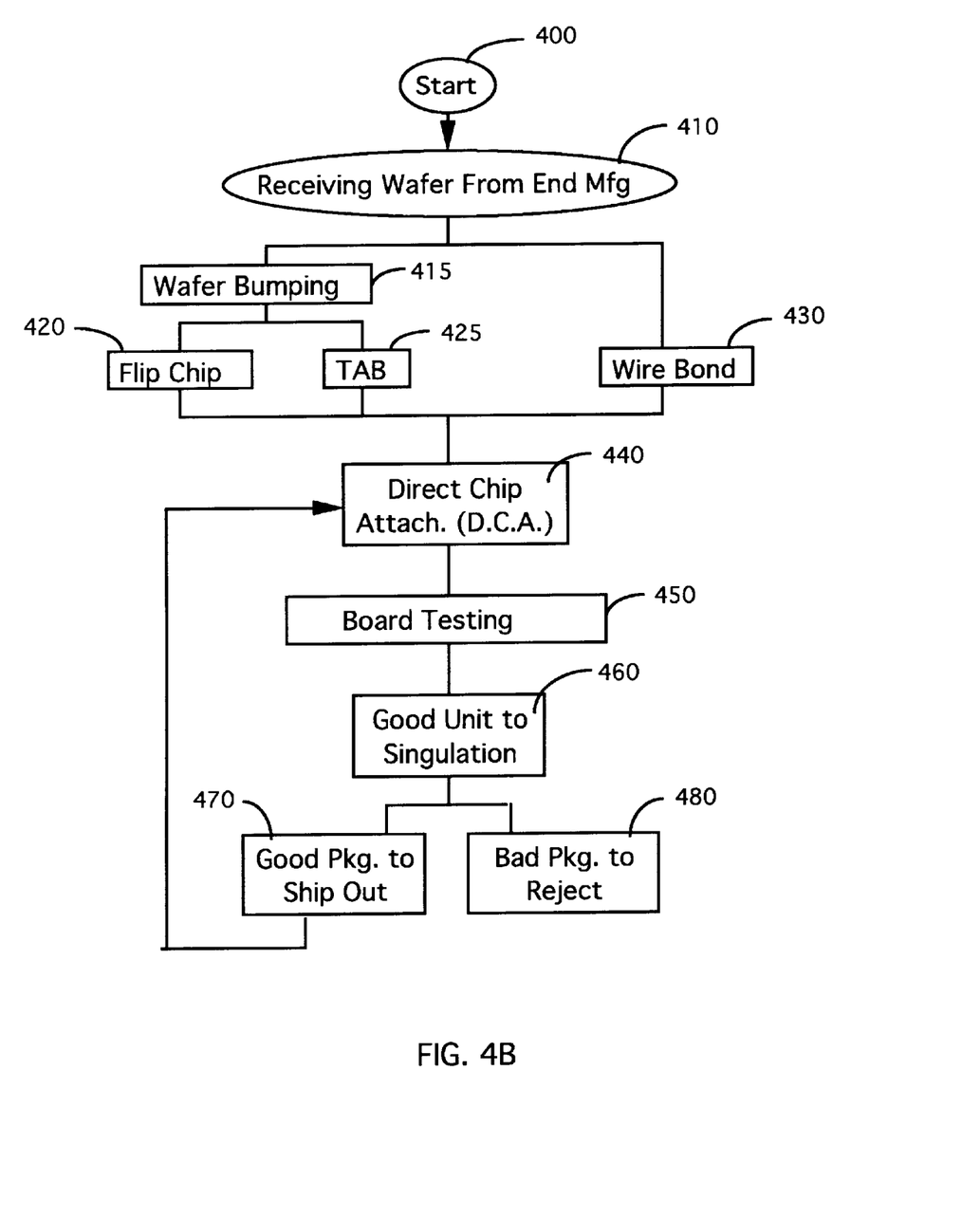

Comparing to the conventional method, FIG. 4B shows a much more simplified processing flow. After the wafer level of works, i.e., steps 400 to steps 430, are completed, the individual chips are directly mounted to a CSP-ready MCM board of this invention by a direct chip attachment method (step 440). A combined burn-in and board level testing process is performed (step 450). If there are bad chips identified, the identified known bad chips can be replaced by a back-side replacement chip attachment method as that described above to repair the MCM assembly for shipment as a good package (step 470). Or, the identified good units are singluated (step 460) and repackaged as a known good CSP and ready for subsequent board mounting (step 460) and the bad chip units are rejected (step 480).

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A single-substrate multiple chip module (MCM) assembly comprising:

a chip-size package (CSP)-ready MCM board having a top surface and a bottom surface, said top surface further includes a plurality of chip connection terminals;

a plurality of bare integrated circuit (IC) chips mounted directly on said top surface of MCM board constituting a single substrate wherein each of said bare IC chips further includes a plurality of connecting means for electrically connecting to said chip connection terminals disposed on said top surface of said MCM board;

said CSP-ready MCM board further includes a plurality of via connectors in electrical connection with each of said chip connection terminals on said top surface; and a plurality of CSF-ready connection terminals distributed according to a pre-defined chip-size package (CSP) ready connection footprint disposed on said bottom surface of said MCM board substantially under said IC chips provided for ready connection by mounting another CSP chip having said pre-defined (CSP) ready connection footprint thereon wherein each of said via connectors disposed in said MCM board for electrically connecting said CSP-ready connection terminals disposed on said bottom surface to said chip connection terminals disposed on said top surface.

2. The single-substrate MCM assembly of claim 1 further comprising:

a plurality of solder balls mounted on said CSP-ready connection terminals on said bottom surface under an identified bad IC chip for mounting said another CSP chip as a replacement CSP chip having said pre-defined chip-size package (CSP) ready connection footprint on said solder balls for totally replacing said identified bad chip.

3. The single-substrate MCM assembly of claim 1 wherein:

each of said chip connection terminals disposed on said top surface is a bonding pad and each of said bare IC chips include a plurality of bonding wires for connecting to a corresponding bonding pads; and said CSP-ready MCM board further includes a plurality of inwardly extending conductive traces for interconnecting each of said bonding pads to a corresponding via connectors disposed in said MCM board for connecting to said CSP ready connection terminals on said bottom surface substantially under said IC chips.

4. The single-substrate MCM assembly of claim 1 wherein:

each of said chip connection terminals disposed on said top surface is a solder balls and each of said bare IC chips is a flip chip including a plurality of contact bumps for contacting and soldering to said solder balls on said top surface; and each of said via connector of said CSP-ready MCM board disposed right under said solder balls for connecting to said solder balls and said CSP ready connection terminals on said bottom surface substantially under said IC chips.

5. The single-substrate MCM assembly of claim 1 wherein:

each of said chip connection terminals disposed on said top surface is a TAB bonding pad and each of said bare IC chips include a plurality of TAB bonding for connecting to a corresponding bonding pads; and said CSP-ready MCM board further includes a plurality of inwardly extending conductive traces for interconnecting each of said TAB bonding pads to a corresponding via connectors disposed in said MCM board for connecting to said CSP-ready connection terminals on said bottom surface substantially under said IC chips.

6. A replacement-chip-ready multiple chip module (MCM) board having a top surface and a bottom surface for mounting and packaging a plurality of integrated circuit (IC) chips on the top surface provided with a plurality of chip connection terminals thereon for electrically connecting to the IC chips, comprising:

a plurality of via connectors in electrical connection with each of said MCM connection terminals; and a plurality of replacement-chip ready connection terminals disposed on said bottom surface distributed according to a pre-defined replacement-chip ready connection footprint substantially under said IC chips provided for ready connection by mounting a replacement chip having said pre-defined replacement-chip ready connection footprint thereon wherein each of said via connectors disposed in said MCM board for electrically connecting said replacement-chip ready connection terminals to said MCM connection terminals.

7. The replacement-chip-ready MCM board of claim 6 wherein:

each of said chip connection terminals disposed on said top surface is a bonding pad; and said replacement-chip-ready MCM board further includes a plurality of inwardly extending conductive traces for interconnecting each of said bonding pads to a corresponding via connectors disposed in said MCM board for connecting to said replacement-chip-ready connection terminals on said bottom surface substantially under said IC chips.

8. The replacement-chip-ready MCM board of claim 6 wherein:

each of said chip connection terminals disposed on said top surface is a solder balls ready for mounting said replacement chip;

each of said via connector of said replacement-chip-ready MCM board disposed right under said solder balls for connecting to said solder balls and said replacement-chip-ready connection terminals on said bottom surface substantially under said IC chips.

9. The replacement-chip-ready MCM board of claim 6 wherein:

each of said chip connection terminals disposed on said top surface is a TAB bonding pad; and said replacement-chip-ready MCM board further includes a plurality of inwardly extending conductive traces for interconnecting each of said TAB bonding pads to a corresponding via connectors disposed in said MCM board for connecting to said replacement-chip-ready connection terminals on said bottom surface substantially under said IC chips.

10. An integrated circuit (IC) chip contained in a singulated chip size package (CSP) comprising:

an IC chip mounted on a cutoff portion of a MCM board includes a top surface terminated at cutoff edges having a plurality of conductive traces extended thereto wherein said plurality of conductive traces comprising cutoff segments from conductive traces provided for interconnecting two neighboring chips mounted on said MCM board prior to a sigulation operation in cutting off said MCM board.

11. The IC chip contained in a singulated CSP of claim 10 further comprising:

a plurality of chip connection terminals disposed on said top surface and a plurality of via connectors disposed in said cutoff portion of said MCM board in electrical connection with each of said chip connection terminals on said top surface; and a plurality of CSP-ready connection terminals distributed according to a pre-defined CSP-chip ready connection footprint disposed on said bottom surface of said cutoff portion of said MCM board substantially under said IC chip provided for mounting a plurality of CSP connection means thereon wherein each of said via connectors electrically connecting said CSP-ready connection terminals to said chip connection terminals.

\* \* \* \* \*